US009153415B2

(12) United States Patent
Scheffers

(10) Patent No.: US 9,153,415 B2
(45) Date of Patent: Oct. 6, 2015

(54) CHARGED PARTICLE LITHOGRAPHY SYSTEM WITH SENSOR ASSEMBLY

(71) Applicant: Mapper Lithography IP B.V., Delft (NL)

(72) Inventor: Paul IJmert Scheffers, Delfgauw (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

(21) Appl. No.: 14/581,728

(22) Filed: Dec. 23, 2014

(65) Prior Publication Data

US 2015/0179398 A1 Jun. 25, 2015

Related U.S. Application Data

(60) Provisional application No. 61/921,002, filed on Dec. 26, 2013.

(30) Foreign Application Priority Data

Dec. 24, 2013 (NL) .................................... 2012029

(51) Int. Cl.
*G21K 5/10* (2006.01)
*G21K 5/00* (2006.01)
*G21K 4/00* (2006.01)
*H01J 37/22* (2006.01)
*H01J 37/20* (2006.01)

(52) U.S. Cl.
CPC ............... *H01J 37/22* (2013.01); *H01J 37/20* (2013.01); *H01J 2237/10* (2013.01); *H01J 2237/202* (2013.01)

(58) Field of Classification Search
USPC ............... 250/397, 398, 491.1, 492.1, 492.2, 250/492.23, 492.3; 355/72, 77
See application file for complete search history.

(56) References Cited

U.S. PATENT DOCUMENTS

| 6,218,671 | B1* | 4/2001 | Gordon et al. ............... 250/397 |
| 2007/0057204 | A1* | 3/2007 | Kruit et al. ............... 250/492.23 |
| 2009/0290139 | A1* | 11/2009 | Van Der Sijs et al. ........... 355/72 |
| 2012/0069317 | A1* | 3/2012 | Peijster ........................... 355/72 |

(Continued)

FOREIGN PATENT DOCUMENTS

| EP | 1 505 630 A2 | 2/2005 |
| JP | 2005-347054 A | 12/2005 |

(Continued)

*Primary Examiner* — Bernard E Souw
(74) *Attorney, Agent, or Firm* — Blakely Sokoloff Taylor & Zafman LLP

(57) ABSTRACT

The invention relates to a charged particle lithography system for transferring a pattern onto a target, said system comprising:

a target positioning device comprising a target holder having a first side for holding the target, a charged particle optical unit for generating a charged particle beam, modulating said charged particle beam, and directing said charged particle beam towards the first side of the target holder, and a sensor assembly comprising a converter element for converting charged particles which impinge on said converter element into light, wherein the converter element is arranged on said target positioning device, a light sensor for detecting the light, wherein the light sensor is arranged at a distance from said target positioning device, and a light optical lens which is arranged between the converter element and the light sensor for directing light originating from said converter element to said sensor.

25 Claims, 6 Drawing Sheets

(56) References Cited

U.S. PATENT DOCUMENTS

2015/0001423 A1* 1/2015 Meijer et al. .............. 250/492.2
2015/0109601 A1* 4/2015 Scheffers et al. .............. 355/74

FOREIGN PATENT DOCUMENTS

WO    WO 2013/037802 A1    3/2013
WO    WO 2013/171177 A1    11/2013

* cited by examiner

CHARGED PARTICLE LITHOGRAPHY SYSTEM WITH SENSOR ASSEMBLY

BACKGROUND

The invention relates to a charged particle lithography system with a sensor assembly.

Such a lithography system is for example disclosed in the International Patent Application WO2007/032670. The lithography systems disclosed in this International Patent Application is arranged for transferring a pattern onto the surface of a target, using a charged particle optical unit for generating a plurality of charged particle beams, modulating said charged particle beams, and directing said charged particle beams towards the surface of the target. The charged particle beams are scanned in one or more directions over the surface of the target, and during said scanning each charged particle beam writes a part of said pattern on said surface of the target.

In order to write a high-resolution pattern on a target, for example a wafer or a mask, the position of each beam at or near the surface to be exposed must preferably be known within a distance of a few nanometers. In order to determine the characteristics of a charged particle beam, and in particular of said plurality of charged particle beams, a sensor is used which is combined with a converter element for converting charged particle beams into a light beams. Said sensor comprises an array of light sensitive detectors located in line with said converter element for detecting said light beams. Preferably the converter element is provided with a blocking element which comprises sharp edges. The converter element, in particular the blocking element thereof, is arranged substantially at the same level as the surface of the target. By scanning a charged particle beam over the converter element in a direction substantially perpendicular to the sharp edges and monitoring the change of light intensity of the light beam corresponding to the charged particle beam, the position and diameter of the charged particle beam can be established.

As disclosed in WO2007/032670 the converter element is arranged directly above the array of light sensitive detectors, which provides a very compact assembly. The array of light sensitive detectors is provided with cabling for communicating the measured data to a control device comprising a processor for processing the measured data to determine the characteristics of a charged particle beam.

In order to position the blocking element substantially at the same level as the surface of the target, the assembly of sensor and converter element is arranged in or adjacent to the target holder. Preferably the assembly is integrated in the target holder.

The target holder is arranged on top of an assembly of stages for accurately moving the target with respect to the charged particle optical unit, and is arranged inside a vacuum chamber. A disadvantage of the integration of the assembly in the target holder inside the vacuum chamber, is that the assembly arranged on top of the assembly of stages must be connected to the control device outside the vacuum chamber, without hindering the accurate moving of the target.

It is an object of the present invention to provide a more convenient positioning of the sensor.

SUMMARY OF THE INVENTION

According to a first aspect, the invention provides a charged particle lithography system for transferring a pattern onto a target, said system comprising:

a target positioning device comprising a target holder having a first side for holding the target, a charged particle optical unit for generating a charged particle beam, modulating said charged particle beam, and directing said charged particle beam towards the first side of the target holder, and a sensor assembly comprising a converter element for converting charged particles which impinge on said converter element into light, wherein the converter element is arranged on said target positioning device, a light sensor for detecting the light, wherein the light sensor is arranged at a distance from said target positioning device, and a light optical lens which is arranged between the converter element and the light sensor for directing light originating from said converter element to said sensor.

The present invention thus provides a solution to the above identified problems by arranging the sensor away from the converter element, for example comprising a blocking element as known from the prior art, and to direct the light originating from said converter element to the sensor using a light optical lens. In order to determine the characteristics of the charged particle beam(s) at the level of the target, the converter element is arranged on said target positioning device. In particular during a determination of the characteristics of the charged particle beam(s), a side of the converter element facing said charged particle optical unit is preferably arranged at substantially the same level as an exposure surface of said target onto which the pattern is to be transferred. Due to the sensor assembly of the invention, the sensor can be arranged at a distance from said target positioning device. Contrarily to the arrangement known in the prior art, at least the sensor of the assembly according to the present invention is arranged at a distance of the target positioning device, in particular at a distance of an assembly of stages of said positioning device. Thus the sensor can be arranged apart from the target positioning device and can suitably be connected to a control device outside the vacuum chamber, without hindering the accurate moving of the target position device.

It is noted that, in an embodiment, the light optical lens may be arranged on said target positioning device, just as the converter element. However, it is preferred that the light optical lens is also arranged at a distance from said target positioning device, just as the light sensor.

In an embodiment, at least the sensor can be arranged outside the vacuum chamber when using a vacuum tight window in the wall of the vacuum chamber for transmitting the light from the converter element to the outside of the vacuum chamber. In this embodiment the connection of the sensor and the control device can be arranged completely outside the vacuum chamber.

In an embodiment, the lens is arranged to project an image of substantially a side of the converter element facing said charged particle optical unit, onto the light sensor. This is in particular advantageous for characterizing multiple charged particle beams which impinge at various locations on the converter element, and using a pixilated sensor, in particular a CMOS array, a CCD array or a diode array, for observing the light emitted at said various locations substantially at the same time. The light emitted at said various locations on said converter element are imaged on various locations, preferably on various pixels, on the surface of the pixilated sensor.

In an embodiment, the charged particle optical unit is arranged at a first side of the target holder, and wherein the light optical lens and the light sensor are arranged at a second side of the target holder, wherein the second side is substantially opposite to the first side. For example, the charged particle optical unit is arranged above the target holder and the light optical lens and the light sensor are arranged below the target holder, or vice versa. In this embodiment the arrangement of the light optical lens and the light sensor does not interfere with the positioning of the charged particle optical unit.

In an embodiment, the charged particle optical unit defines an optical axis, wherein the light optical lens and the light sensor are arranged on said optical axis. According to this embodiment, the light optical lens and the light sensor are arranged at a fixed position at least with respect to the optical charged particle optical unit, and are substantially permanently aligned with the optical axis of the charged particle optical unit. In order to establish the characteristics of the charged particle beam(s) only the converter element, which is arranged onto said target positioning device, needs to be moved by said target positioning device into the beam path of the charged particle beam(s) at or near the optical axis of the charged particle optical unit.

In an embodiment, said target holder and said charged particle optical unit are at least partially arranged inside a vacuum chamber, and wherein said vacuum chamber comprises a compartment extending to the inside of said vacuum chamber, wherein an inside of said compartment is separate from the inside of the vacuum chamber, wherein said compartment comprises a window at a side facing said target holder, and wherein at least said light optical lens is arranged inside said compartment. The inside of said compartment is separate from the inside of the vacuum chamber, and thus can be at atmospheric pressure. The compartment comprises a window at a side facing said target holder for transmitting the light from the converter element to the inside of the compartment and thus to the outside of the vacuum chamber. The light optical lens is arranged inside said compartment, preferably close to the window. Because the compartment extends to the inside of said vacuum chamber, the light optical lens can be arranged outside the vacuum chamber and at the same time much closer to the target holder.

By arranging the light optical lens outside the vacuum chamber, the light optical lens does not have to be a vacuum compatible lens. Standard lenses can be applied in the arrangement according to the invention.

By arranging the light optical lens inside the compartment closer to the target holder, the Numerical Aperture (NA) of the light optical system comprising said lens can be larger, and hence its light-gathering ability and resolution is advantageously larger.

In an embodiment, also the sensor is arranged inside said compartment. In an embodiment, the light sensor and the light optical lens are arranged in the compartment as one unit. In an embodiment, the compartment also extends to the outside of the vacuum chamber. In this case the dimensions of the compartment can be chosen so as to be able to conveniently contain the assembly of light optical lens and light sensor.

In an embodiment, the inside of said compartment is substantially open to the outside of said vacuum chamber. Thus the inside of said compartment is in fluid connection with the surrounding of the vacuum chamber, which is usually arranged inside a clean room which is substantially at or slightly above atmospheric pressure.

Although the compartment may be formed as a part of the wall of the vacuum chamber, in an embodiment, the compartment is arranged in an opening in said wall of said vacuum chamber. The compartment of this embodiment can be installed in and removed from the vacuum chamber as one unit.

Due to the nature of charged particle beams, their trajectory can be changed by magnetic and/or electric fields. In the charged particle optical unit this is, inter alia, used to modulate the charged particle beams and to direct the charged particle beams towards the target. In order to shield the charged particle optical unit from ambient magnetic and/or electric fields, which might disturb the trajectories of the charged particle beams and thus induces a deviation from the desired location of the charged particle beams on the target, the vacuum wall is preferably provided with a shielding facing the inside of said vacuum chamber. The shielding comprising one or more layers of a µ-metal. Such shielding is arranged to attenuate the earth magnetic field by a considerable extend, for example an attenuation of a factor of approximately 1000 is possible.

When arranging the compartment in an opening of the wall of said vacuum chamber, the shielding is discontinuous at the opening. In order to at least partially compensate for the opening in the shielding, in an embodiment, the charged particle lithography system further comprises a tube part substantially surrounding a part of the compartment adjacent to the vacuum wall, wherein said tube part extends along said compartment in an outward direction with respect to the vacuum chamber. In an embodiment, said tube part comprises at least a layer of µ-metal or permalloy.

Preferably the tube part is connected to the shielding of the wall arranged at the inside of the vacuum chamber. In order to provide a suitable connection between the tube part and the shielding inside the vacuum chamber, in an embodiment, said tube part extends along said compartment to an inside of the vacuum chamber, and said tube part comprises a radial extending lip which is arranged at the inside of the vacuum chamber and extends substantially parallel to the vacuum wall around the opening in said vacuum wall. In an embodiment, the vacuum wall is provided with a shielding facing the inside of said vacuum chamber, and the radial extending lip at least partially covers said shielding around the opening in said vacuum wall, wherein said shielding is arranged between the radial extending lip and the vacuum wall.

In an embodiment, said compartment comprises a flange part which is arranged to connect to the vacuum wall to provide a vacuum seal. In an embodiment, a flange ring is arranged between the wall of said vacuum chamber and said flange part. In an embodiment, said flange ring comprises at least a layer of µ-metal or permalloy. Using such a flange ring between the flange part of the compartment and the wall of said vacuum chamber provides a convenient way for the shielding to pass the vacuum barrier.

In an embodiment, said flange ring comprises a tube part substantially surrounding a part of the compartment adjacent to the vacuum wall, wherein said tube part extends along said compartment in an outward direction with respect to the vacuum chamber. In an embodiment, said tube part comprises at least a layer of µ-metal or permalloy. The tube part and the flange ring of this embodiment is formed as one unit.

Preferably the tube part is connected to the shielding of the wall arranged at the inside of the vacuum chamber. In order to provide a suitable connection between the tube part and the shielding inside the vacuum chamber, in an embodiment, said tube part is a first tube part, and wherein the flange ring further comprises a second tube part substantially surrounding a part of the compartment adjacent to the vacuum wall, wherein said second tube part extends along said compartment in an inward direction with respect to the vacuum chamber. In an embodiment, said second tube part comprises at least a layer of µmetal or permalloy. In an embodiment, said second tube part comprises a radial extending lip which extends substantially parallel to the vacuum wall around the opening in said vacuum wall. In an embodiment, the vacuum wall is provided with a shielding facing the inside of said vacuum chamber, and wherein radial extending lip at least partially covers said shielding around the opening in said vacuum wall, wherein said shielding is arranged between the radial extending lip and the vacuum wall. In an embodiment, said flange part of the compartment is arranged at a side of said vacuum wall facing the inside of the vacuum chamber.

In an embodiment, the compartment extending to the inside of said vacuum chamber is arranged at a side of said target holder facing away from the first side for holding the target. Thus the sensor is arranged on as side of the converter element, which preferably is arranged at the target holder, facing away from the charged particle optical unit. In a convenient embodiment, the charged particle optical unit is arranged above the target holder, and the compartment is arranged below the target holder.

In an embodiment, the charged particle optical unit defines an optical axis, wherein the light optical lens and the sensor are arranged on said optical axis. The sensor arrangement thus is always in alignment with the charged particle optical unit. In order to determine the characteristics of the charged particle beams or the calibrate or recalibrate the lithography system, the assembly of stages move the target holder to a position in which the charged particle beams impinge on a converter element. At that particular position of the assembly of stages, a through opening is provided from the converter element to the window of the compartment in order to allow the light originating from the charged particle beams hitting the converter element, to pass to said compartment, through said window, and to said sensor assembly substantially without obstruction.

In an embodiment, a diameter of a part of the compartment arranged inside said vacuum chamber is larger than a diameter of a part of the compartment adjacent to the wall of said vacuum chamber. This allows to use a relatively small opening in the wall of said vacuum chamber in combination with a light optical lens having a large diameter. Due to the small opening in the wall, on the one hand, the opening in the shielding is also small which reduces the influence of ambient magnetic and/or electric fields when compared with a larger opening in the shielding. On the other hand, using a light optical lens with a larger diameter increases the Numerical Aperture (NA) of the light optical system and hence its light-gathering ability and resolution is advantageously larger when compared with a lens with a smaller diameter.

According to a second aspect, the invention relates to a method for determining the characteristics of one or more charged particle beams at the level of a target in a charged particle lithography system wherein said system comprising:

a target positioning device comprising a target holder having a first side for holding the target, a charged particle optical unit for generating a charged particle beam, modulating said charged particle beam, and directing said charged particle beam towards the first side of the target holder, and a sensor assembly comprising a converter element for converting charged particles which impinge on said converter element into light, wherein the converter element is arranged on said target positioning device, a light sensor for detecting the light, wherein the light sensor is arranged at a distance from said target positioning device, and a light optical lens which is arranged between the converter element and the light sensor for directing light originating from said converter element to said sensor, wherein said method comprises the step of moving said target positioning device to a position in which the charged particle beams impinge on the converter element.

In particular, since the light sensor is arranged at a distance from said target positioning device and accordingly is not arranged on the target positioning device, the converter element is moved independently from the light sensor.

In an embodiment, wherein at least the light sensor is arranged at a substantially fixed position with respect to the charged particle optical unit, and is substantially permanently aligned with the charged particle optical unit. In an embodiment, also the light optical lens is arranged at a substantially fixed position with respect to the charged particle optical unit, and is substantially permanently aligned with the charged particle optical unit. In this embodiment and with regard to the sensor assembly, only the converter is moved by said target positioning device into the beam path of the charged particle beam(s) at or near the optical axis of the charged particle optical unit. The other parts of the sensor assembly, in particular the light optical lens and the light sensor are arranged at substantially fixed position with respect to the charged particle optical unit.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
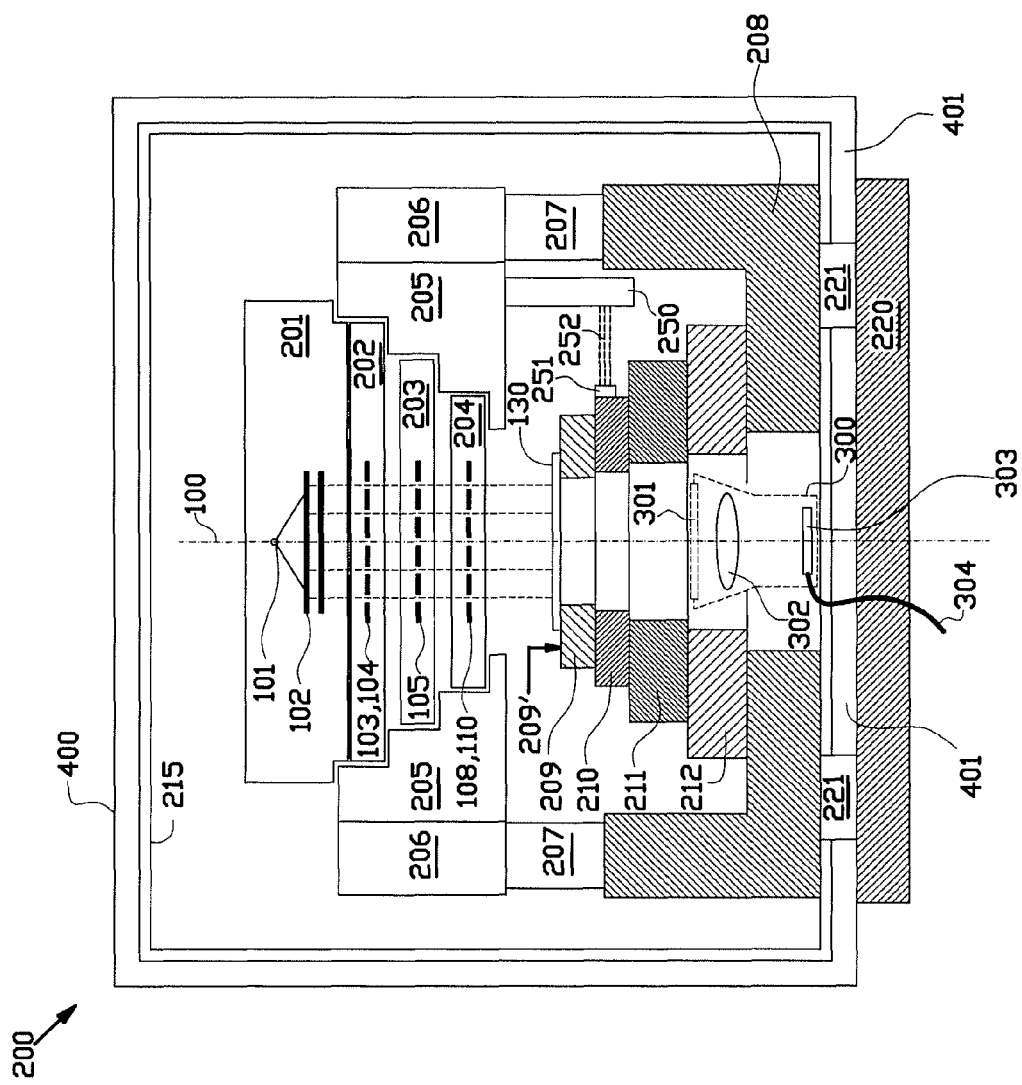
FIG. 1 shows a simplified block diagram illustrating the principal elements of a modular lithography system.

FIG. 1 shows a simplified block diagram illustrating the principal elements of a modular lithography system 200. The lithography system is preferably designed in a modular fashion to permit ease of maintenance. Major subsystems are preferably constructed in self-contained and removable modules, so that they can be removed from the lithography machine with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems. In the embodiment shown in FIG. 1, these modular subsystems include:

an illumination optics module 201 including the charged particle beam source 101 and beam collimating system 102, an aperture array and condenser lens module 202 including aperture array 103 and condenser lens array 104, a beam switching module 203 including beam blanker array 105, and projection optics module 204 including beam stop array 108, beam deflector array 109, and projection lens arrays 110.

In the example shown in FIG. 1, the alignment frame comprises an alignment inner sub-frame 205 and an alignment outer sub frame 206. A frame 208 supports the alignment sub-frames 205 and 206 via vibration damping mounts 207.

The modules 201, 202, 203, 204 together form a charged particle optical unit for generating a charged particle beam, modulating said charged particle beam, and directing said charged particle beam towards the first side of a target holder.

The target positioning device comprises a target holder 209, also referred to as wafer table 209, having a first side 209' facing the charged particle optical unit. On said first side 209' a target, for example a wafer 130, can be arranged. The wafer table 209 is in turn mounted on a chuck 210.

The wafer table 209 and chuck 210 are arranged on a short stroke stage 211 which is arranged for driving said chuck 210 over a small distance along all six degrees of freedom. The short stroke stage 211 is mounted on top of a long stroke stage 212 which is arranged for driving said short stroke stage 211 and the chuck 210 along two orthogonal directions (X and Y) in an at least substantially horizontal plane.

The lithography machine 200 is enclosed in vacuum chamber 400, which includes a mu metal (µ metal) shielding layer or layers 215. The shielding 215 is in a convenient manner arranged as a lining of the vacuum chamber 400. The machine rests on base plate 220 supported by frame members 221.

In an embodiment the frame 208 and the bottom wall 401 of the vacuum chamber 400 are formed as one unit. For example the frame 208 and the bottom wall 401 are machined from a single monolithic block of material. The wafer table 209, the chuck 201, the short stroke stage 211 and the long stroke stage 212 are mounted on or in the frame (or bottom wall) 208.

The position of the wafer 130 and wafer table 209 with respect to the charged particle optical unit 201, 202, 203, 204 is measured with a measuring device 250 which is attached to the alignment sub-frame 205 which monitors the position of the chuck 210 with respect to the measuring device 250. The measuring device 250 comprises, for example, an interferometer system and the chuck 210 is then provided with a mirror 251 for reflecting the light beams 252 from the interferometer system.

Figure 2:
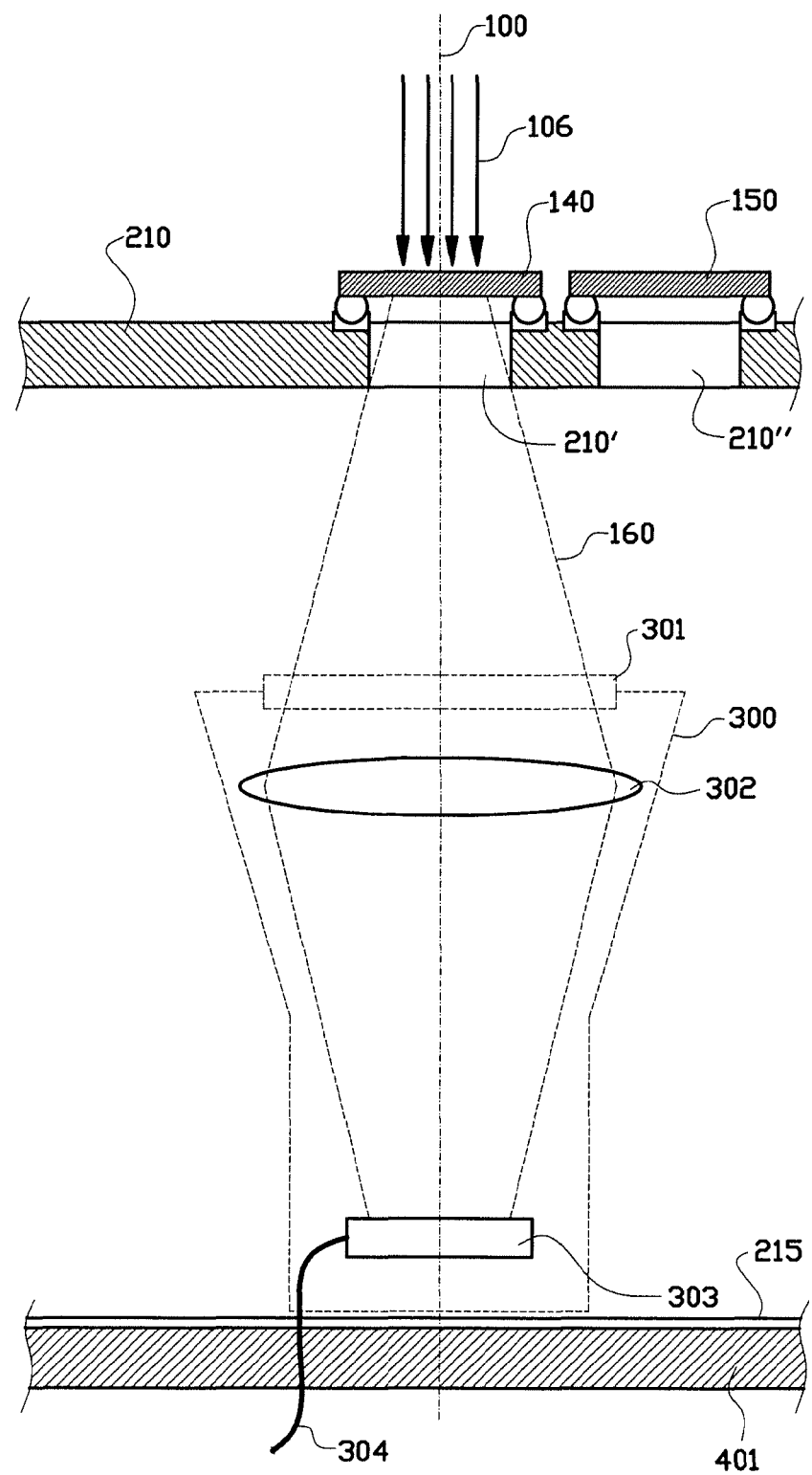
FIG. 2 shows a schematic drawing of a part of the lithography system according to a first embodiment of the invention.

In this example, the system 200 further comprises a sensor assembly comprising:

converter elements 140, 150, as shown in more detail in FIG. 2, which converter elements 140, 150 are arranged on the target position device, in particular on the chuck 210 thereof;

a light optical lens 302 and a light sensor 303 which are arranged spaced apart from the target positioning device 212, 211, 210, 209.

In the embodiment shown in FIGS. 1 and 2, the light optical lens 302, and the light sensor 303 are arranged inside the vacuum chamber 400, and the cabling 304 for connecting the sensor 303 with a control unit (not shown) traverses the wall 401 of said vacuum chamber 400. In use, the light optical lens 302 and the light sensor 303 are arranged and need to operate under vacuum conditions.

Alternatively, the vacuum chamber 400 may be provided with a compartment 300. The compartment 300 is arranged at a side of said wafer table 209 facing away from the first side 209' for holding the wafer 130. In particular, the charged particle optical unit 201, 202, 203, 204 is arranged above the wafer table 209, and the compartment 300 is arranged below the wafer table 209. The charged particle optical unit 201, 202, 203, 204 defines an optical axis 100, wherein the light optical lens 302 and the sensor 303 are arranged on said optical axis 100.

The inside of said compartment 300 is separate from the inside of the vacuum chamber 400. The compartment 300 comprises a window 301 at a side facing said target holder, in particular said chuck 210. In this example, the compartment 300, comprising the light optical lens 302 and the sensor 303, is arranged inside said vacuum chamber 400.

As schematically shown in FIG. 1, a diameter of a part of the compartment 300 facing the target holder, in particular the part of the compartment 300 comprising the window 301 and the light optical lens 302, is larger than a diameter of a part of the compartment 300 adjacent to the wall 401 of said vacuum chamber 400.

As schematically shown in FIG. 1, the compartment 300 may extend into the vacuum chamber 400 even partially into the space of the long stroke stage 212, which is then provided with the necessary openings to provide space for the compartment 300 without hindering the movement of the stage.

Actually, the arrangement of the invention provides for a contactless measurement of the light generated by the converter element 140, 150 by the sensor 303. This provides an addition advantage of the arrangement of the invention: the same sensor 303 can be used to detect the light generated by several converter elements 140, 150.

As shown in detail in FIG. 2, the chuck 210 onto which the wafer table 209 with a wafer 130 is mounted is provided with at least two converter elements 140, 150. These converter elements 140, 150 are arranged at a position next to a mounting position for the wafer table 209, for example by means of a kinematic mount which is known per se. When the characteristics of one or more charged particle beams 106 at the level of a target in the charged particle lithography system needs to be determined, said target positioning device, in particular the chuck 210 which is provided with the converter elements 140, 150, is moved to a position in which the charged particle beams 106 impinge on the converter element 140. It is noted that the converter element 140 is moved independently from the light sensor 303. In addition it is noted, that the light sensor 303 and the light optical lens 302 are arranged at a substantially fixed position with respect to the charged particle optical unit 201, 202, 203, 204, and are substantially permanently aligned with the charged particle optical unit, in particular with the optical axis 100, and wherein, with regard to the sensor assembly 140, 302, 303, only the converter 140 is moved by said target positioning device into the beam path of the charged particle beam(s) 106 at or near the optical axis 100 of the charged particle optical unit. The chuck 210 can be positioned by actuating the short stroke stage 211 and/or the long stroke stage 212, in order to move the chuck 210 in a direction substantially perpendicular to the optical axis 100, for positioning either one of the converter elements 140, 150 at the optical axis 100.

As shown in FIG. 2, a first converter element 140 is arranged at the optical axis 100. When this first converter element 140 is irradiated by one or more charged particle beams 106, the charged particle beams that hit the converter element 140 generate light 160 which is imaged by the light optical lens 302 on the sensor 303. The first converter element 140 comprises, for example, a scintillator in the form of a YAG (Yttrium Aluminum Garnet) material with a blocking layer on top. The blocking layer is composed of a heavy material preferably of a tungsten alike material, and is shaped in pattern as disclosed in WO2007/32670 for example for determining the position of the one or more charged particle beams 106. Below the position of the first converter element 140, the chuck 210 is provided with a first through opening 210' for passing the light 160 generated by the charged particle beam(s) 106 from the converter element 140, via the light optical lens 302 to the sensor 303.

The second converter element 150 comprises, for example, a scintillator in the form of a YAG material with a mis-cut Si wafer in which a through opening on top as disclosed in WO2013/112041. Due to the mis-cut at least one of the edges of the through opening comprises a side wall at an undercut angle, which is used a knife edge for accurately determining the spot size of the one or more charged particle beams 106. Below the position of the second converter element 150, the chuck 201 is provided with a second through opening 210" for passing the light generated by the charged particle beam(s) 106 from the converter element 150, via the light optical lens 302 to the sensor 303, at least when the second converter element 150 is moved into the charged particle beam(s) 106.

Hence, the first converter element 140 may comprise a plate assembly as disclosed in WO2007/32670 for determining a beam position, and the second converter element 150 may comprise a plate assembly as disclosed in WO2013/112041 for determining the beam spot size. By moving the chuck 210 in a suitable position with respect to the charged particle optical unit, a desired converter element 140, 150 can be arranged at the optical axis 100 for performing measurements to establish the position or spot size the charged particle beam(s).

Figure 3:
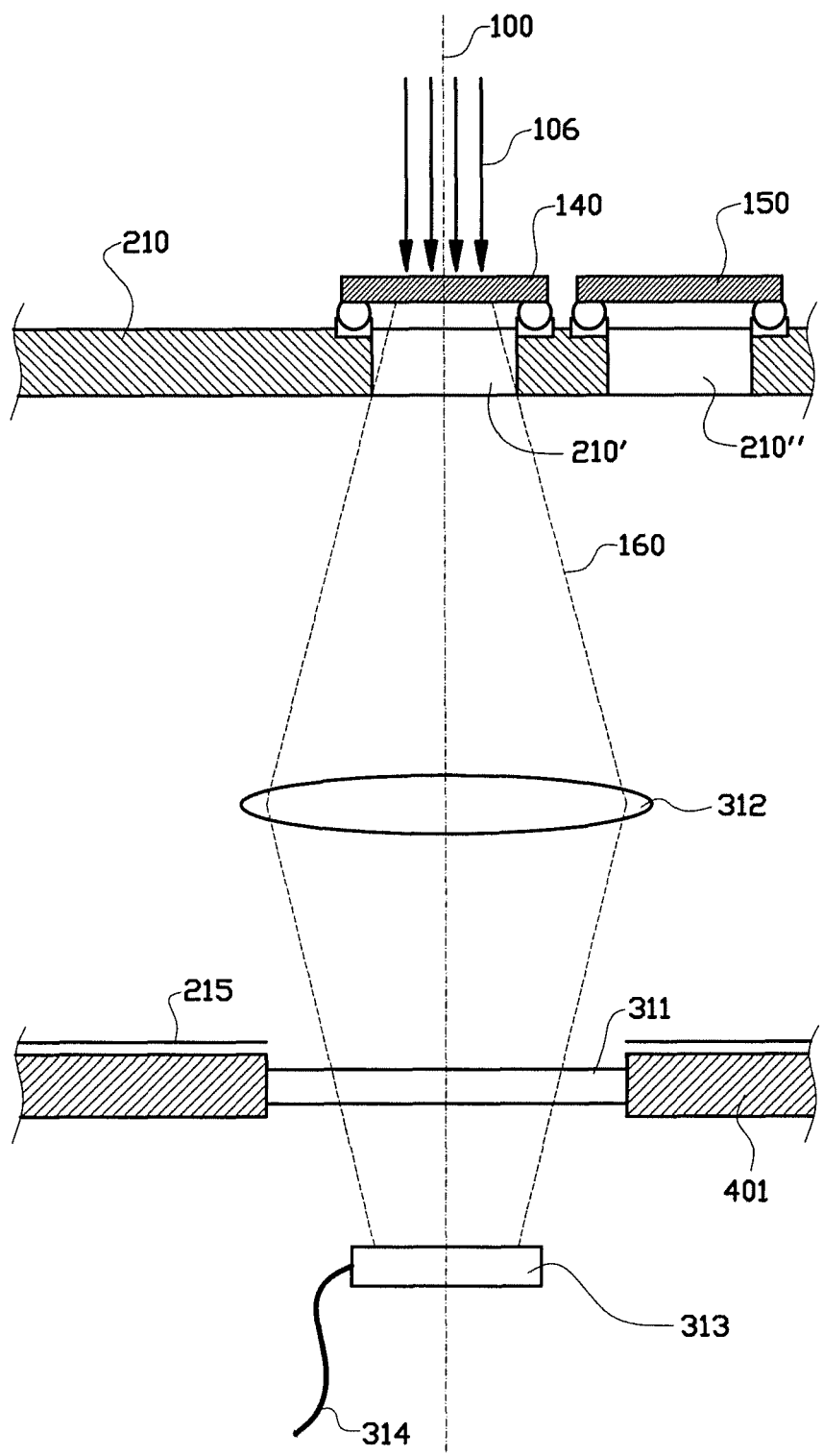
FIG. 3 shows a schematic drawing of a part of the lithography system according to a second embodiment of the invention.

A second exemplary embodiment is shown in FIG. 3. In this example, the light optical lens 312 is arranged inside the vacuum chamber 400, whereas the light sensor 313 is arranged outside the vacuum chamber 400. Between the light optical lens 312 and the light sensor 313, the wall 401 of the vacuum chamber 400 is provided with a window 311 for passing the light 160 generated by the charged particle beam(s) 106 from the converter element 140, via the light optical lens 312 inside said vacuum chamber 400, to the sensor 313 outside said vacuum chamber 400. It is noted that in order to pass the light 160 to the outside of the vacuum chamber 400, the shielding layer 215 is provided with an opening at least at the position of the window 311.

Figure 4:
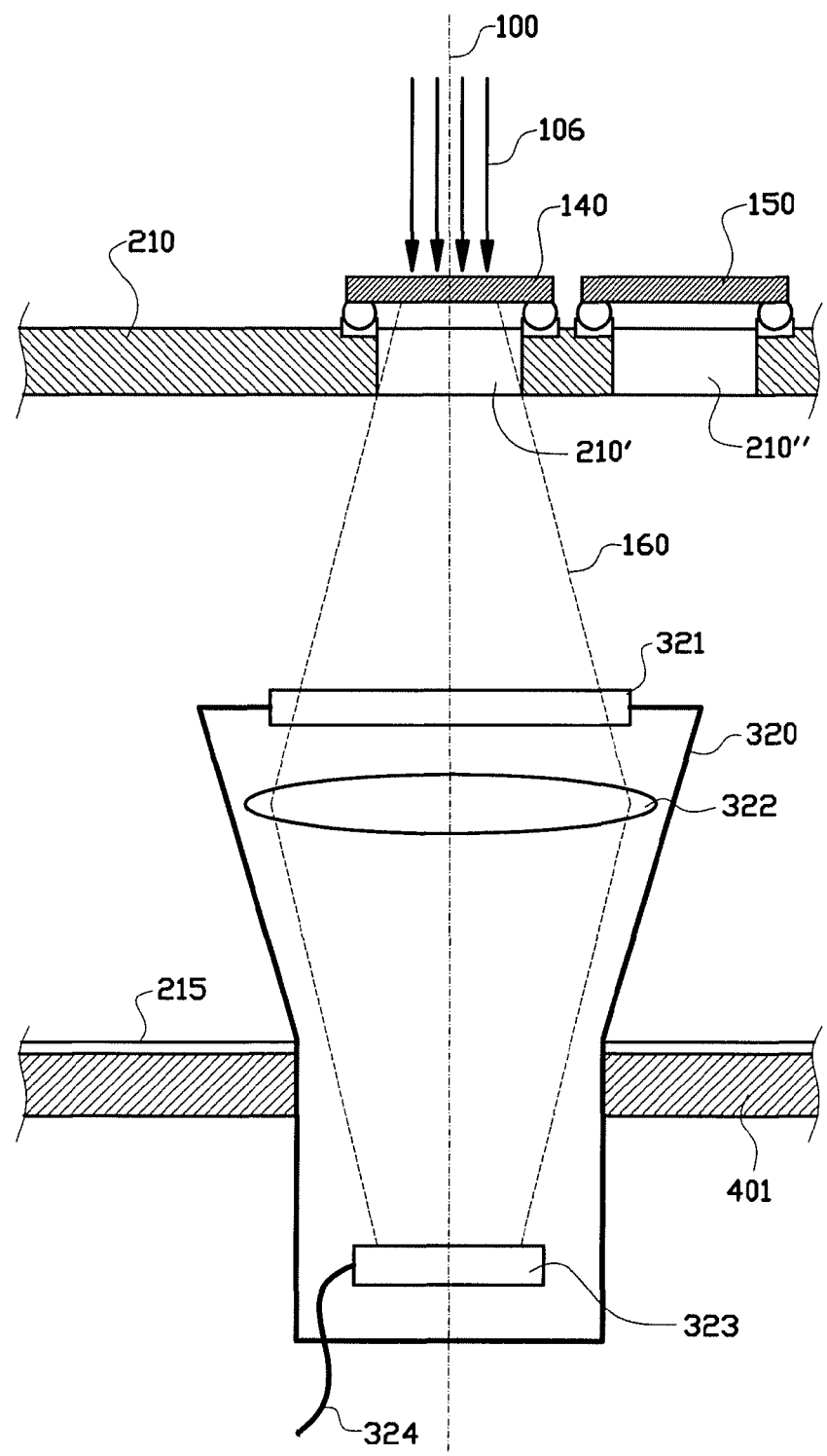
FIG. 4 shows a schematic drawing of a part of the lithography system according to a third embodiment of the invention.

A third exemplary embodiment is shown in FIG. 4. In this example the light optical lens 322 and the light sensor 323 are arranged inside a compartment 320. The compartment 320 is arranged in an opening in the bottom wall 401 of said vacuum chamber 400, which is provided with a shielding layer 215. As schematically indicated in FIG. 4, the compartment 320 is part of the bottom wall 401 of the vacuum chamber 400 and is provided with a window 321 at a side facing the target positioning device, in particular the chuck 210 thereof. The inside of the compartment 320 is separate from the inside of the vacuum chamber 400. Hence the inside of the compartment 300 can be at ambient pressure, and the light optical lens 322 and/or the sensor 323 do not need to be vacuum compatible. In addition, the cabling 324 for communicating between the sensor 323 and a control device (not shown) does not need to be fed through the wall of the vacuum chamber.

Figure 5:
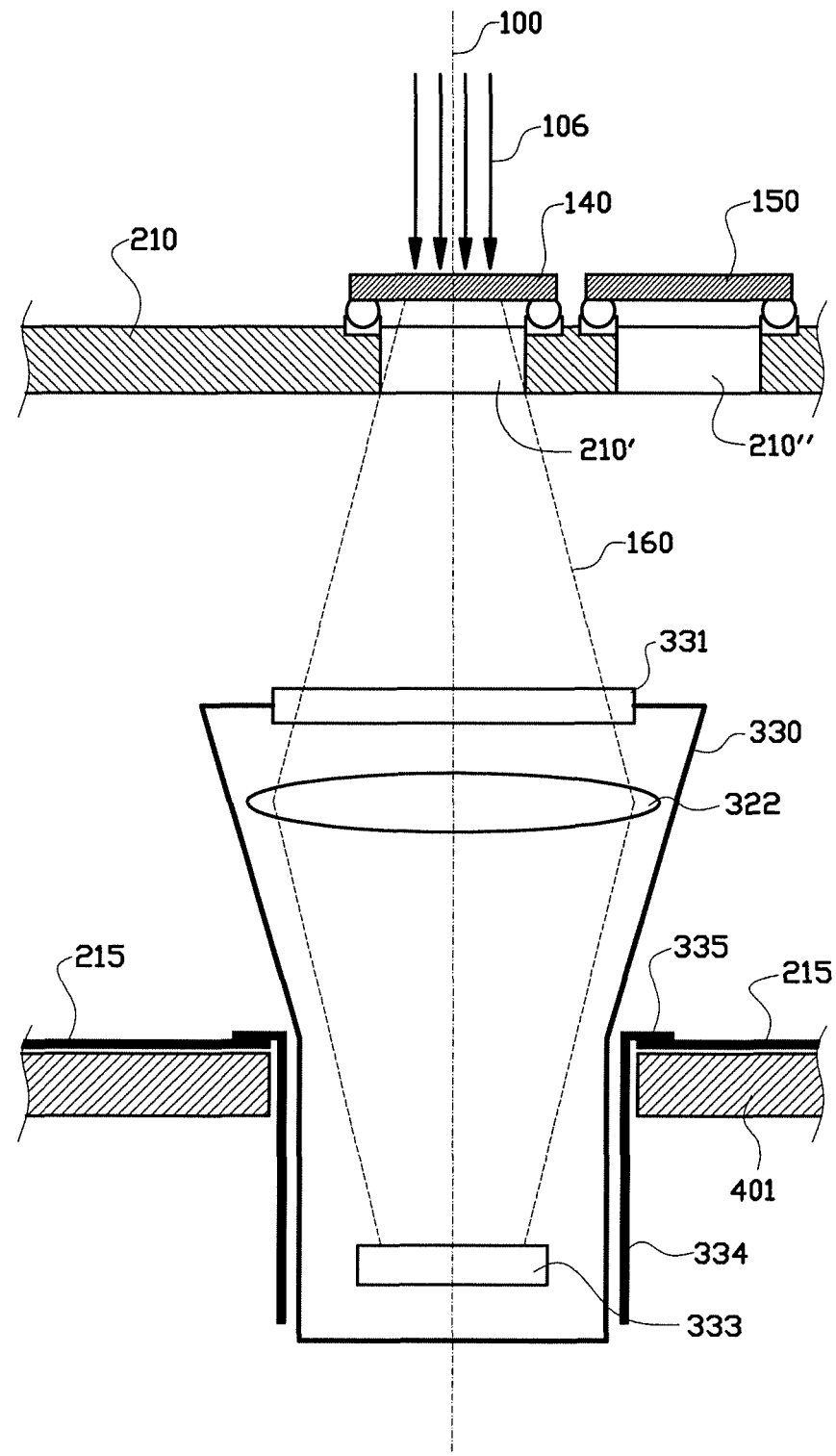
FIG. 5 shows a schematic drawing of a part of the lithography system according to a fourth embodiment of the invention.

A fourth exemplary embodiment is shown in FIG. 5. In this example, the compartment 330 is arranged in an opening in the bottom wall 401 of said vacuum chamber 400, which is provided with a shielding layer 215. In addition, this embodiment comprising a tube part 334 substantially surrounding a part of the compartment 330 adjacent to the vacuum wall, wherein said tube part 334 extends along said compartment 330 in an outward direction, in particular a downward direction in this example, with respect to the vacuum chamber 400. The tube part 334 comprises at least a layer of μ-metal or permalloy, just as the shielding 215.

As schematically shown in FIG. 5, said tube part 334 extends along said compartment 330 to an inside of the vacuum chamber 400. The tube part 334 comprises a radial extending lip 335, which is arranged at the inside of the vacuum chamber 400 and extends substantially parallel to the wall of the vacuum chamber 400 around the opening in said wall. The radial extending lip 335 at least partially covers the shielding 215 in the vacuum chamber 400 around the opening in said wall of the vacuum chamber 400, wherein said shielding 215 is arranged between the radial extending lip 335 and the wall 401. The radial extending lip 335 is in contact with the shielding 215.

It is noted, that in the schematic drawing, some space has been left between the wall 401 of the vacuum chamber 400, the tube part 334, and the compartment 330. This has been done for clarity reasons. Actually, the tube part 334 is tightly arranged between the wall of the vacuum chamber 400 and the circumferential wall of the compartment 330 in order to provide a closure of the vacuum chamber 400.

It further noted, that the light optical lens 332 and the sensor 333 are both arranged inside the compartment 330, and that the compartment 330 is provided with a window 331 at a side facing upwards, toward said chuck 210.

Figure 6:
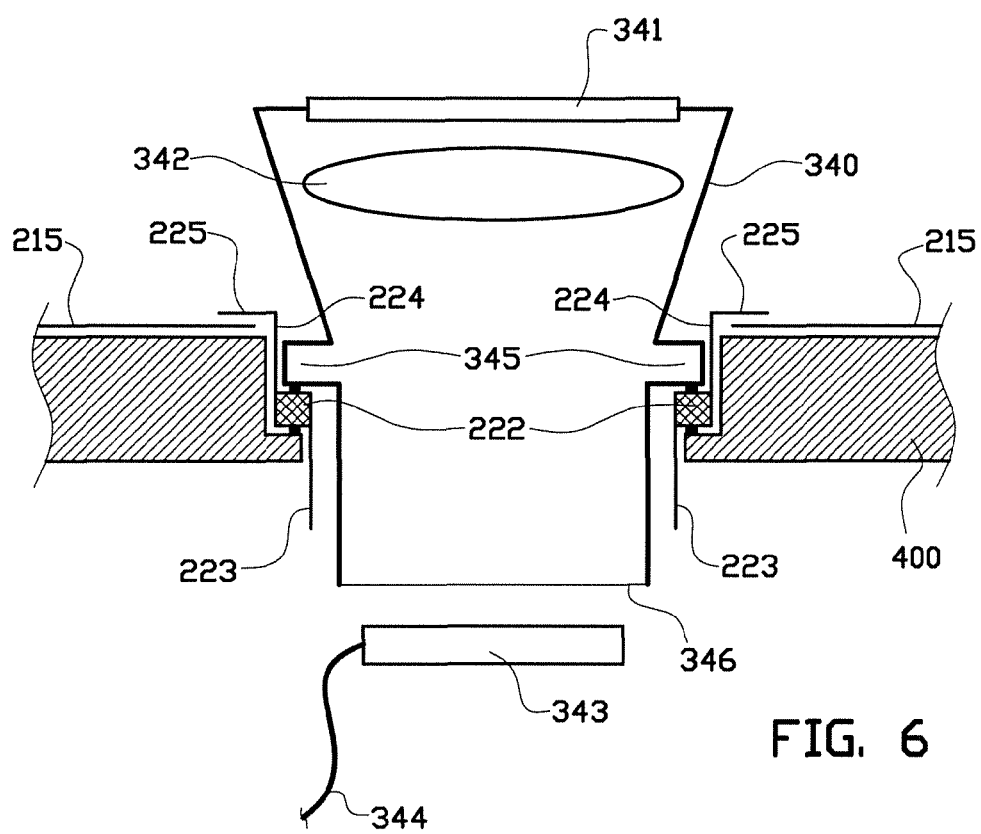
FIG. 6 shows a schematic drawing of a part of the lithography system according to a fifth embodiment of the invention.

A fifth exemplary embodiment is shown in FIG. 6. In this example, the compartment 340 is arranged in an opening in the bottom wall 401 of said vacuum chamber 400, which is provided with a shielding layer 215. As schematically indicated in FIG. 6, the compartment 340 comprises a flange part 345 which is arranged to connect to the wall of the vacuum chamber 400 to provide a vacuum seal. A flange ring 222 is arranged between the wall of said vacuum chamber 400 and said flange part 345. Said flange ring 222 comprises at least a layer of μ-metal or permalloy, just as the shielding 215 of the vacuum chamber 400.

As indicated in FIG. 6, said flange ring 222 comprises a first tube part 223 substantially surrounding a part of the compartment 340 adjacent to the wall of the vacuum chamber 400. Said first tube part 223 extends along said compartment 340 in an outward direction, in particular a downward direction, with respect to the vacuum chamber 400. Said first tube part comprises at least a layer of μ-metal or permalloy.

In addition, the flange ring 222 further comprises a second tube part 224 substantially surrounding a part of the compartment 340 adjacent to the wall of the vacuum chamber 400. Said second tube part 224 extends along said compartment 320 in an inward direction with respect to the vacuum chamber 400. The second tube part 224 comprises a radial extending lip 225 which extends substantially parallel to the wall around the opening in said vacuum chamber 400. As indicated in FIG. 6, the wall of the vacuum chamber 400 is provided with a shielding 215 facing the inside of said vacuum chamber 400. The radial extending lip 225 at least partially covers and contacts said shielding 215 around the opening in said wall, wherein said shielding 215 is arranged between the radial extending lip 225 and the wall of the vacuum chamber 400.

The second tube part 224 and the radially extending lip 225 comprises at least a layer of μ-metal or permalloy. The radial extending lip 225 is in contact with the shielding 215.

It is noted, that in this embodiment said flange part 345 of the compartment 340 is arranged at a side of said wall of the vacuum chamber 400 facing to the inside of the vacuum chamber 400.

It is further noted, that at least the light optical lens 342 is arranged near the window 341 in the compartment 340, which is substantially open at the bottom side 346, and that the sensor 343 of the sensor assembly, is arranged outside the compartment 340 and outside the vacuum chamber 400.

It is to be understood that the above description is included to illustrate the operation of the preferred embodiments and is not meant to limit the scope of the invention. From the above discussion, many variations will be apparent to one skilled in the art that would yet be encompassed by the spirit and scope of the present invention.

For example, the compartment 340 of the fifth example having the flange part 345, may also be adapted in order that the sensor 343 can be arranged inside the compartment 340, as is for example shown in the embodiment of FIGS. 4 and 5. Alternatively the compartment 320, 330 of the third and fourth embodiments, may also be adapted on order to arrange the sensor 323, 333 outside the compartment 320, 330, as for example shown in the embodiment in FIG. 6.

The invention claimed is:

1. Charged particle lithography system for transferring a pattern onto a target, said system comprising:
 a target positioning device comprising a target holder having a first side for holding the target,
 a charged particle optical unit for generating a charged particle beam, modulating said charged particle beam, and directing said charged particle beam towards the first side of the target holder, and
 a sensor assembly comprising a converter element for converting charged particles which impinge on said converter element into light, wherein the converter element is arranged on said target positioning device, a light sensor for detecting the light, wherein the light sensor is arranged at a distance from said target positioning device, and a light optical lens which is arranged between the converter element and the light sensor for directing light originating from said converter element to said sensor.

2. Charged particle lithography system according to claim 1, wherein the lens is arranged to project an image of substantially a side of the converter element facing said charged particle optical unit, onto the light sensor.

3. Charged particle lithography system according to claim 1, wherein the light sensor comprises a pixilated sensor, in particular CCD array or a diode array.

4. Charged particle lithography system according to claim 1, wherein the charged particle optical unit is arranged at a first side of the target holder, wherein the light optical lens and the light sensor are arranged at a second side of the target holder, and wherein the second side is substantially opposite to the first side.

5. Charged particle lithography system according to claim 1, wherein the charged particle optical unit defines an optical axis, wherein the light optical lens and the light sensor are arranged on said optical axis.

6. Charged particle lithography system according to claim 1, wherein said target holder and said charged particle optical unit are at least partially arranged inside a vacuum chamber, and wherein said vacuum chamber comprises a compartment extending to the inside of said vacuum chamber, wherein an inside of said compartment is separate from the inside of the vacuum chamber, wherein said compartment comprises a window at a side facing said target holder, and wherein at least said light optical lens is arranged inside said compartment.

7. Charged particle lithography system according to claim 6, wherein also the sensor is arranged inside said compartment.

8. Charged particle lithography system according to claim 6, wherein the inside of said compartment is substantially open to the outside of said vacuum chamber.

9. Charged particle lithography system according to claim 6, wherein the compartment is arranged in an opening in said wall of said vacuum chamber.

10. Charged particle lithography system according to claim 9, further comprising a tube part substantially surrounding a part of the compartment adjacent to the vacuum wall, wherein said tube part extends along said compartment in an outward direction with respect to the vacuum chamber, wherein said tube part comprises at least a layer of μ-metal or permalloy.

11. Charged particle lithography system according to claim 10, wherein said tube part extends along said compartment to an inside of the vacuum chamber, wherein said tube part comprises a radial extending lip, which is arranged at the inside of the vacuum chamber and extends substantially parallel to the vacuum wall around the opening in said vacuum wall.

12. Charged particle lithography system according to claim 11, wherein the vacuum wall is provided with a shielding facing the inside of said vacuum chamber, and wherein radial extending lip at least partially covers said shielding around the opening in said vacuum wall, wherein said shielding is arranged between the radial extending lip and the vacuum wall.

13. Charged particle lithography system according to claim 9, wherein said compartment comprises a flange part which is arranged to connect to the vacuum wall to provide a vacuum seal.

14. Charged particle lithography system according to claim 13, wherein a flange ring is arranged between the wall of said vacuum chamber and said flange part, wherein said flange ring comprises at least a layer of μ-metal or permalloy.

15. Charged particle lithography system according to claim 14, wherein said flange ring comprises a tube part substantially surrounding a part of the compartment adjacent to the vacuum wall, wherein said tube part extends along said compartment in an outward direction with respect to the vacuum chamber, wherein said tube part comprises at least a layer of μ-metal or permalloy.

16. Charged particle lithography system according to claim 15, wherein said tube part is a first tube part, and wherein the flange ring further comprises a second tube part substantially surrounding a part of the compartment adjacent to the vacuum wall, wherein said second tube part extends along said compartment in an inward direction with respect to the vacuum chamber, wherein said second tube part comprises at least a layer of μ-metal or permalloy.

17. Charged particle lithography system according to claim 16, wherein said second tube part comprises a radial extending lip which extends substantially parallel to the vacuum wall around the opening in said vacuum wall, wherein the vacuum wall is provided with a shielding facing the inside of said vacuum chamber, and wherein radial extending lip at least partially covers said shielding around the opening in said vacuum wall, wherein said shielding is arranged between the radial extending lip and the vacuum wall.

18. Charged particle lithography system according to claim 14, wherein said flange part of the compartment is arranged at a side of said vacuum wall facing the inside of the vacuum chamber.

19. Charged particle lithography system according to claim 6, wherein the target holder comprises a first side for holding the target, wherein the compartment extending to the inside of said vacuum chamber is arranged at a side of said target holder facing away from the first side for holding the target.

20. Charged particle lithography system according to claim 19, wherein the charged particle optical unit is arranged above the target holder, and wherein the compartment is arranged below the target holder.

21. Charged particle lithography system according to claim 6, wherein a diameter of a part of the compartment arranged inside said vacuum chamber is larger than a diameter of a part of the compartment adjacent to the wall of said vacuum chamber.

22. Charged particle lithography system according to claim 6, wherein the compartment also extends to the outside of the vacuum chamber.

23. Method for determining the characteristics of one or more charged particle beams at the level of a target in a charged particle lithography system, wherein said system comprising:
  a target positioning device comprising a target holder having a first side for holding the target,
  a charged particle optical unit for generating a charged particle beam, modulating said charged particle beam, and directing said charged particle beam towards the first side of the target holder, and
  a sensor assembly comprising a converter element for converting charged particles which impinge on said converter element into light, wherein the converter element is arranged on said target positioning device, a light sensor for detecting the light, wherein the light sensor is arranged at a distance from said target positioning device, and a light optical lens which is arranged between the converter element and the light sensor for directing light originating from said converter element to said sensor,
  wherein said method comprises the step of moving said target positioning device to a position in which the charged particle beams impinge on the converter element.

24. Method according to claim 23, wherein the converter element is moved independently from the light sensor.

25. Method according to claim 23, wherein the light sensor and the light optical lens are arranged at a substantially fixed position with respect to the charged particle optical unit, and are substantially permanently aligned with the charged particle optical unit, wherein, with regard to the sensor assembly, only the converter is moved by said target positioning device into the beam path of the charged particle beam(s) at or near the optical axis of the charged particle optical unit.

* * * * *